(12) United States Patent
Kong et al.

(10) Patent No.: US 12,604,383 B2
(45) Date of Patent: Apr. 14, 2026

(54) CURRENT SOURCE DEVICE FOR ELECTROSTATIC DISCHARGE AND DISPLAY DEVICE INCLUDING THE SAME

(71) Applicant: LX SEMICON CO., LTD., Daejeon (KR)

(72) Inventors: Min Cheol Kong, Daejeon (KR); Ji Hwan Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 78 days.

(21) Appl. No.: 18/532,346

(22) Filed: Dec. 7, 2023

(65) Prior Publication Data

US 2024/0196498 A1 Jun. 13, 2024

(30) Foreign Application Priority Data

Dec. 7, 2022 (KR) ........................ 10-2022-0169608
Nov. 30, 2023 (KR) ........................ 10-2023-0170961

(51) Int. Cl.
*H05B 45/54* (2020.01)
*H05B 47/24* (2020.01)
*H05K 9/00* (2006.01)

(52) U.S. Cl.
CPC ............. *H05B 45/54* (2020.01); *H05B 47/24* (2020.01); *H05K 9/0067* (2013.01)

(58) Field of Classification Search
CPC ...... H05B 45/54; H05B 47/24; H05B 45/395; H05K 9/0067; H10D 89/60;
(Continued)

(56) References Cited

U.S. PATENT DOCUMENTS 6,483,354 B1 * 11/2002 Gasparik .......... H03K 19/00384
327/317
8,461,769 B2 6/2013 Shiu et al.
(Continued)

FOREIGN PATENT DOCUMENTS

WO 2022127469 A1 6/2022

OTHER PUBLICATIONS

Swagatam: "How to Protect MOSFETs—Basics Explained—Homemade Circuit Projects," Sep. 14, 2021, XP093146673, retrieved from the Internet: URL:https://www.homemade-circuits.com/mosfet-protection-basics-explained-is/ on Mar. 28, 2024.
(Continued)

*Primary Examiner* — Thienvu V Tran
*Assistant Examiner* — Muaamar Qahtan Al-Taweel
(74) *Attorney, Agent, or Firm* — ROTHWELL, FIGG, ERNST & MANBECK, P.C.

(57) ABSTRACT

A current source device for electrostatic discharge and a display device including the same are disclosed. The current source device includes a sourcing circuit including a first MOS transistor configured to transmit a current flowing from a pad to a first node in response to a current control voltage, and a second MOS transistor configured to transmit the current flowing from the first node to a ground in response to a bias voltage, and a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal.

16 Claims, 12 Drawing Sheets

(58) Field of Classification Search
  CPC .. G09G 2330/06; G09G 2330/08; G09G 3/32;
                        H03K 17/163
  See application file for complete search history.

(56)                References Cited

U.S. PATENT DOCUMENTS

| | | | | |
|---|---|---|---|---|
| 8,581,520 | B1 * | 11/2013 | Wray ..................... | H05B 45/20 |
| | | | | 315/307 |
| 8,704,501 | B2 * | 4/2014 | Tseng ..................... | G05F 1/561 |
| | | | | 323/280 |
| 10,548,187 | B2 * | 1/2020 | Brower ................... | B60Q 1/52 |
| 10,636,357 | B1 * | 4/2020 | Brownlow ............... | G09G 3/32 |
| 2008/0290911 | A1 * | 11/2008 | Williams ............... | H03K 17/18 |
| | | | | 327/109 |
| 2009/0230998 | A1 | 9/2009 | Hayashi | |
| 2017/0288545 | A1 * | 10/2017 | Yamada ................. | H02M 1/08 |
| 2020/0092963 | A1 | 3/2020 | Xie et al. | |
| 2024/0038146 | A1 | 2/2024 | Ma | |

OTHER PUBLICATIONS

European Search Report dated Apr. 23, 2024, issued for the European Patent Application No. 23214857.7, 11 pages.

\* cited by examiner (a)                      (b)

CURRENT SOURCE DEVICE FOR ELECTROSTATIC DISCHARGE AND DISPLAY DEVICE INCLUDING THE SAME

CROSS REFERENCE APPLICATION(S)

This application claims the benefit of earlier filing date and right of priority to Korean Application Nos. 10-2022-0169608, filed on Dec. 7, 2022, and 10-2023-0170961, filed on Nov. 30, 2023, the contents of which are hereby incorporated by reference herein in their entirety.

TECHNICAL FIELD

The present disclosure relates to a current source device, and more specifically, to the current source device that provides a discharge path for incoming static electricity and a display device including the same.

BACKGROUND

LED (Light Emitting Diode) is a current-driven device, so the LED can be used in various ways by adjusting the current flowing through the LED. The LED is in the spotlight as a backlight for recent LED TV panel because it is superior to other existing light emitters in terms of power consumption and heat generation.

FIG. 1 shows a conventional LED driver circuit.

Referring to FIG. 1, the conventional LED driver circuit 100 includes a power supply unit 110, an LED string 120, and a driving circuit 130.

The LED string 120 includes a plurality of LEDs connected in series or parallel.

The power supply unit 110 supplies driving current to the LED string 120.

The driving circuit 130 includes a current source circuit 131 that controls the magnitude of the current output from the power supply unit 110 to the LED string 120, and a control circuit 132 that controls an operation of the current source circuit 131.

FIG. 2 shows the LED string and the driving circuit shown in FIG. 1.

Referring to FIG. 2, the LED string 120 is composed of a plurality of LEDs connected in series, and the current source circuit 131 includes an amplifier 210, a transistor 220, and a load 230, used to source current.

A static electricity protection circuit is generally installed at the input terminal, so the current source circuit 131 shown in FIG. 2 does not include the static electricity protection circuit. Accordingly, a problem occurs in which the transistor 220 is destroyed by static electricity applied to a common terminal of the LED string 120 and the current source circuit 131.

On the other hand, the LED string 120 and the current source circuit 131 are divided into separate modules, and when connected and used with a conductor such as an electric wire, the transistor 220 is also destroyed even by static electricity applied at the connection part.

DISCLOSURE OF THE INVENTION

Technical Problem

In this context, the present disclosure is to assess how to protect a device or circuit from a static electricity flowing into an internal circuit as well as how to operate in a normal situation without the incoming static electricity.

Also, the present disclosure is to provide a display device such as digital signage including the above-described current source device.

Technical Solution

In order to achieve the above object, a current source device according to one of the various embodiments of the present disclosure can include a sourcing circuit including a first MOS transistor configured to transmit a current flowing from a pad to a first node in response to a current control voltage, and a second MOS transistor configured to transmit the current flowing from the first node to a ground in response to a bias voltage; and a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal, wherein the current flowing from the pad contains a current corresponding to static electricity, wherein a withstand voltage of the first MOS transistor is higher than that of the second MOS transistor.

A display device according to one of the various embodiments of the present disclosure can include a signage including an LED string configured to operate using current supplied from a power supply; and a current source device configured to control an amount of a current supplied from the power supply to the LED string, wherein the current source device includes: a sourcing circuit including a first MOS transistor configured to transmit a current flowing from a pad to a first node in response to a current control voltage, and a second MOS transistor configured to transmit the current flowing from the first node to a ground in response to a bias voltage; and a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal, wherein the current flowing from the pad contains a current corresponding to static electricity, wherein a withstand voltage of the first MOS transistor is higher than that of the second MOS transistor.

A display device according to one of the various embodiments of the present disclosure can include a current source device including: a sourcing circuit including a first MOS transistor configured to transmit a current flowing from a pad to a first node in response to a current control voltage, and a second MOS transistor configured to transmit the current flowing from the first node to a ground in response to a bias voltage; a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal; and a selection unit configured to control a discharge function of the current source device; and a discharge circuit configured to discharge the current corresponding to static electricity flowing from the pad of the current source device to the ground, wherein a withstand voltage of the first MOS transistor is higher than that of the second MOS transistor.

Effect of the Invention

The present disclosure allows for stably protecting an internal circuit from incoming static electricity, providing various discharge paths without using high-voltage electrostatic discharge elements, to effectively discharging incoming static electricity, and not only reducing a chip size but also reducing unnecessary power consumption.

DETAILED DESCRIPTION OF THE INVENTION

Figure 1:
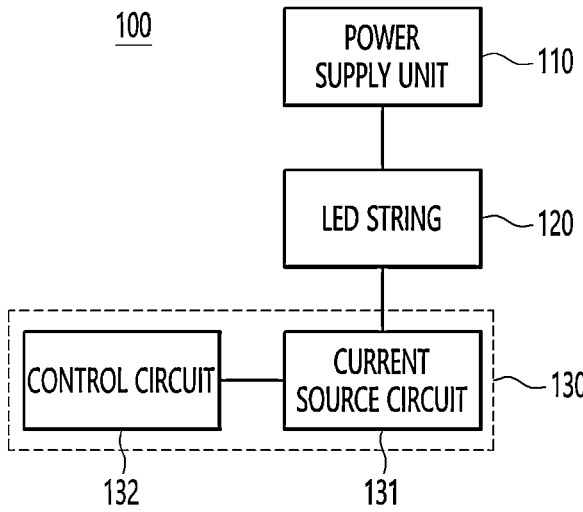
FIG. 1 is an embodiment of a conventional LED driver circuit.
Figure 2:
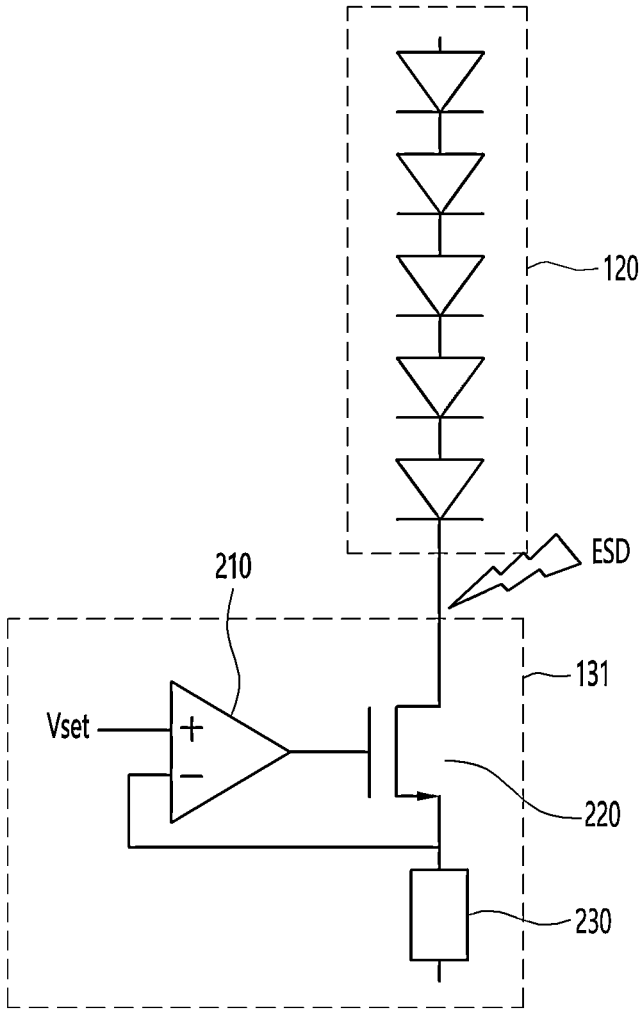
FIG. 2 is an example of the LED string and driving circuit shown in FIG. 1.

In order to fully understand the present disclosure, its operational advantages, and the objectives achieved by practicing the present disclosure, reference should be made to the accompanying drawings illustrating exemplary embodiments of the present disclosure and the contents described in the accompanying drawings.

Hereinafter, the present disclosure will be described in detail by explaining preferred embodiments of the present disclosure with reference to the accompanying drawings. The same reference numerals in each drawing indicate the same member.

Figure 3:
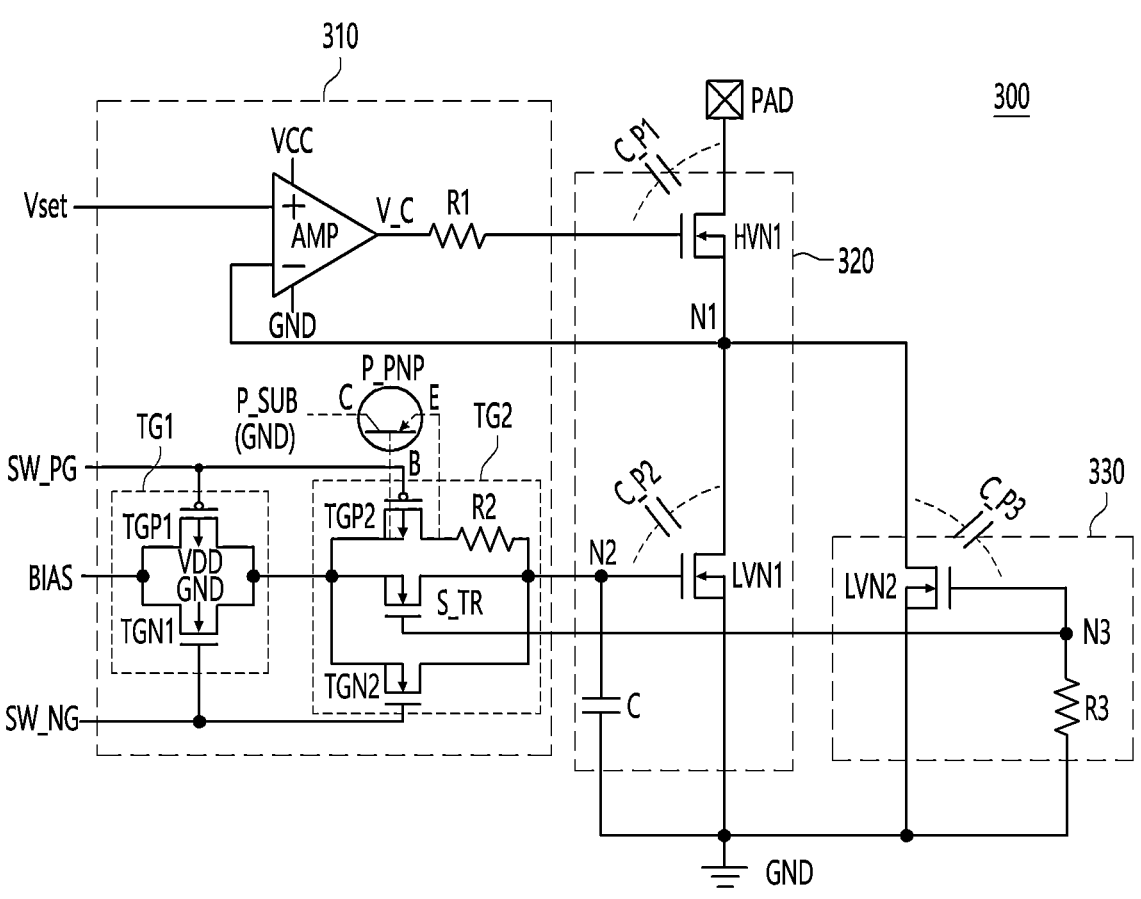
FIG. 3 illustrates a circuit diagram of a current source device according to an embodiment of the present invention.

FIG. 3 illustrates a circuit diagram of a current source device according to an embodiment of the present invention.

The current source device 300 (or current source unit) shown in FIG. 3 can be applied to kinds of circuits that perform a function of adjusting or controlling the amount of current applied from an outside. However, hereinafter, for convenience of understanding and explanation of the technology, the current source device 300 will be described as being used to adjust the amount of current flowing from the main power source through the LED string.

Referring to FIG. 3, the current source device 300 according to an embodiment of the present disclosure can include a control circuit 310 and a sourcing circuit 320. The current source device 300 can further include a discharge circuit 330.

The sourcing circuit 320 can provide current paths through which the current applied to the pad (PAD) flows to the ground power source GND under the control of the control circuit 310.

The discharge circuit 330 can provide a path for discharging static electricity flowing into the current source device 300 to the ground power source GND.

The control circuit 310 can include an amplifier AMP, a first resistor R1, a first transmission gate TG1 (Transmission Gate1), and a second transmission gate TG2 (Transmission Gate2) used to perform the above functions.

The amplifier AMP can generate a current control voltage (V_C) that determines the amount of current to flow in the current path provided by the sourcing circuit 320 in response to setting voltage (Vset) applied from the outside. The setting voltage (Vset) can be applied to a positive input terminal (+) of the amplifier AMP. A negative input terminal (−) of the amplifier AMP can be connected to the first node N1. The output terminal of the amplifier AMP can output the current control voltage (V_C). Meanwhile, the first node N1 will be described later.

One terminal of the first resistor R1 can be connected to the output terminal of the amplifier AMP. The other terminal of the first resistor R1 can be connected to the sourcing circuit 320.

In response to a switch control signal SW, the first transmission gate TG1 can transmit a bias voltage BIAS applied to one terminal of the first transmission gate TG1 to one terminal of the second transmission gate TG2 connected to the other terminal of the first transmission gate TG1. In the first transmission gate TG1, two terminals of a first P-type MOS transistor TGP1 and the first N-type MOS transistor TGN1, that is, a drain terminal and a source terminal, are connected to each other. The first transmission gate TG1 can be a switching element in which control signals (SW_PG, SW_NG) with opposite voltage levels are applied to the gate terminal of the two MOS transistors TGP1 and TGN1.

Here, the switching element can represent an element that electrically connects both terminals or electrically insulates both terminals depending on the voltage level of the switch control signal SW. Hereinafter, "switching the transmission gate" means turning the transmission gate on (TURN ON) to electrically connect both terminals of the transmission gate, or turning the transmission gate off (TURN OFF) to electrically isolate both terminals of the transmission gate.

The second transmission gate TG2 can transmit the bias voltage BIAS applied to one terminal of the second transmission gate TG2 to the second node N2, which is the other terminal of the second transmission gate TG2, in response to the switch control signal SW. The switch control signal SW can be used in common for the first transmission gate TG1 and the second transmission gate TG2.

The second transmission gate TG2 can be the same as the first transmission gate TG1 in that it is an element in which one terminal of the second P-type MOS transistor TGP2 and the second N-type MOS transistor TGN2 are connected to each other.

However, the second transmission gate TG2 according to an embodiment of the present disclosure can include a short transistor S_TR which performs a function of suppressing the generation of a peak voltage at one terminal of the second transmission gate TG2 during the discharge function.

The short transistor S_TR can have both terminals, that is, the drain terminal and the source terminal, connected to one terminal and the other terminal of the second transmission gate TG2, respectively. And the gate terminal of the short transistor S_TR can be connected to the third node N3. The short transistor S_TR can switch one terminal and the other terminal of the second transmission gate TG2 in accordance with the voltage level of the third node N3.

Meanwhile, the second transmission gate TG2 according to an embodiment of the present disclosure can further include a second resistor R2 that functions to prevent a current from flowing into a parasitic PNP transistor P_PNP.

The second resistor R2 can be disposed between one terminal of the second P-type MOS transistor TGP2 and the other terminal of the second transmission gate TG2, that is, the second node N2.

Alternatively, the second transmission gate TG2 according to an embodiment of the present disclosure can include the short transistor S_TR that performs a function of suppressing the generation of a peak voltage at one terminal of the second transmission gate TG2, and a second resistor R2 that functions to prevent current from flowing through the parasitic PNP transistor P_PNP during performing the discharge function.

Since the other terminal of the second N-type MOS transistor TGN2 is connected to the second node N2, the other terminal of the second N-type MOS transistor TGN2 can be connected to the other terminal of the second resistor R2.

The parasitic PNP transistor P_PNP is not a circuit element actually designed by a circuit designer, but can represent a circuit created by the horizontal and vertical structures of patterns and their electrical characteristics during the process of integrating the designed circuit elements on a wafer.

Referring to FIG. 3, the emitter terminal E of the parasitic PNP transistor P_PNP can be parasitically created by the common terminal of the second P-type MOS transistor TGP2 and the second resistor R2. The base terminal B of the parasitic PNP transistor P_PNP can be parasitically created by the common terminal of the second P-type MOS transistor TGP2 and one terminal of the second transmission gate TG2. And the collector terminal C of the parasitic PNP transistor P_PNP can be parasitically created by a P-type substrate (P_SUB) on which the second P-type MOS transistor TGP2 is generated.

The sourcing circuit 320 can include a high-voltage N-type first MOS transistor HVN1, a low-voltage N-type first MOS transistor LVN1, and a capacitor C.

One terminal of the high-voltage N-type first MOS transistor HVN1 can be connected to the pad (PAD). The other terminal of the high-voltage N-type first MOS transistor HVN1 can be connected to the first node N1. And a gate terminal of the high-voltage N-type first MOS transistor HVN1 can be connected to the other terminal of the first resistor R1. Accordingly, the high-voltage N-type first MOS transistor HVN1 can be turned on according to the voltage level of the other terminal of the first resistor R1 to allow the current applied from the pad (PAD) to flow to the first node N1, or turned off to block the current flowing from the pad (PAD) to the first node N1.

One terminal of the low-voltage N-type first MOS transistor LVN1 can be connected to the first node N1. The other terminal of the low-voltage N-type first MOS transistor LVN1 can be connected to the ground power source GND.

And the gate terminal of the low-voltage N-type first MOS transistor LVN1 can be connected to the second node N2. Accordingly, the low-voltage N-type first MOS transistor LVN1 can be turned on according to the voltage level of the second node N2 to allow the current flowing from the pad (PAD) via the first node N1 to the ground power source GND, or turned off to block the current from flowing from the first node N1 to the ground power source GND.

The capacitor C can be disposed between the second node N2 and the ground power source GND.

Here, a withstand voltage of the high-voltage N-type first MOS transistor HVN1 can be a relatively higher than that of the low-voltage N-type first MOS transistor LVN1. For example, when the withstand voltage of the high-voltage N-type first MOS transistor HVN1 can be about 80V, the withstand voltage of the low-voltage N-type first MOS transistor LVN1 can be about 5V. However, the present disclosure is not limited to the values of the withstand voltages.

The high-voltage N-type first MOS transistor HVN1 should be able to pass a significant amount of current, so the gate width of the high-voltage N-type first MOS transistor HVN1 should be at least several millimeters. Accordingly, a significant amount of area on the layout should be assigned to the high-voltage N-type first MOS transistor HVN1.

The reason why the high-voltage N-type first MOS transistor HVN1 should be disposed where it is connected to the pad (PAD) is because the voltage level of the pad (PAD) ranges from −0.3V to 80V. However, the withstand voltage of the high-voltage N-type first MOS transistor HVN1 can be manufactured differently depending on various embodiments to which the high-voltage N-type first MOS transistor HVN1 is applied.

Both the high-voltage N-type first MOS transistor HVN1 and the low-voltage N-type first MOS transistor LVN1 should be turned on to form a current path from the pad (PAD) to the ground power source GND, so the current source device 300 can perform its function normally.

The discharge circuit 330 can include a low-voltage N-type second MOS transistor LVN2.

The discharge circuit 330 can include a third resistor R3.

Alternatively, the discharge circuit 330 can include a low-voltage N-type second MOS transistor LVN2 and a third resistor R3.

One terminal of the low-voltage N-type second MOS transistor LVN2 can be connected to the first node N1, and the other terminal of the low-voltage N-type second MOS transistor LVN2 can be connected to the ground power source GND.

The third resistor R3 can be disposed between the gate terminal of the low-voltage N-type second MOS transistor LVN2 and the ground power source GND.

The current source device 300 according to an embodiment of the present disclosure can include a plurality of parasitic capacitors.

Three parasitic capacitors C_P1, C_P2, C_P3 are shown in FIG. 3. Three parasitic capacitors C_P1, C_P2, C_P3 are parasitic capacitors which are generated by a gate oxide between one terminal of each MOS transistor, that is, the active region and the gate terminal pattern.

Hereinafter, the normal operating characteristics (FIG. 4) of the current source device 300 according to an embodiment of the present disclosure shown in FIG. 3 and the operating characteristics (FIG. 5) when static electricity flows into the current source device 300 according to an embodiment of the present disclosure shown in FIG. 3 will be sequentially described.

Figure 4:
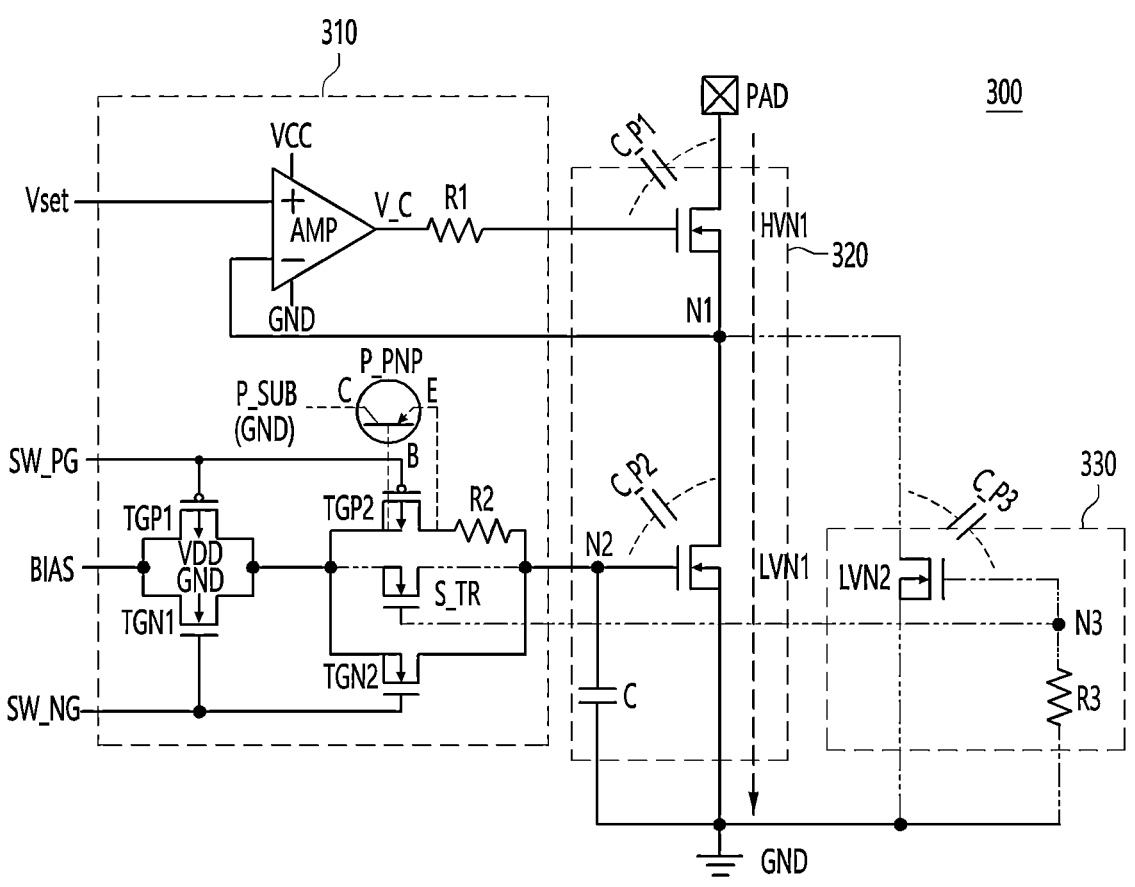
FIG. 4 is a diagram illustrating the operation characteristics of the current source device of FIG. 3 when performing a normal current source function.

First, FIG. 4 is a diagram illustrating the operation characteristics of the current source device 300 of FIG. 3 when performing a normal current source function.

Referring to FIG. 4, when a normal current flows into the current source device 300, both MOS transistors HVN1 and LVN1 of the sourcing circuit 320 can be turned on so that the current flows through the current path (dotted arrow) from the pad (PAD) leading to the ground power source (GND). Accordingly, the normal function of the current source device 300 can be performed. The current sourced from the current source device 300 can be determined by the setting voltage (Vset), and the bias voltage (BIAS) in accordance with the voltage level of the switch control signal SW can activate the low-voltage N-type first MOS transistor LVN1.

As described above, if the current applied to the current source device 300 is in accordance with the normal operation of the current source device 300, the voltage dropped across the pad (PAD) can be –3V to 80V. When the current source device 300 operates normally, the voltage level dropped at the first node N1 should be at least lower than 80V, and can be assumed to be about 10V, for example. However, it is not limited to these numbers.

When the voltage level of one terminal, that is, the first node N1, of the low-voltage N-type second MOS transistor LVN2 included in the discharge circuit 330 has a voltage level of about 10V, the third parasitic capacitor C_P3 generated at one terminal of the low-voltage N-type second MOS transistor LVN2 cannot sufficiently increase the voltage of the gate terminal of the low-voltage N-type second MOS transistor LVN2. Therefore, the low-voltage N-type second MOS transistor LVN2 cannot be turned on. That is, in order for the low-voltage N-type second MOS transistor LVN2 to turn on, the voltage difference (Vgs) of the voltage of the third node N3 connected to the gate terminal of the low-voltage N-type second MOS transistor LVN2 and the ground power source should be higher than a threshold voltage of the low-voltage N-type second MOS transistor LVN2, but since the condition as described above is not satisfied, the low-voltage N-type second MOS transistor LVN2 therefore remains turned-off.

When a normal current flows into the current source device 300, the voltage level of the third node N3 cannot turn on the short transistor S_TR.

Therefore, for this reason, both the discharge circuit 330 and the short transistor S_TR can be in an inactive state. The double-dash dash line shown in FIG. 4 can be intended to distinguish inactivated elements from normally operating elements.

Figure 5:
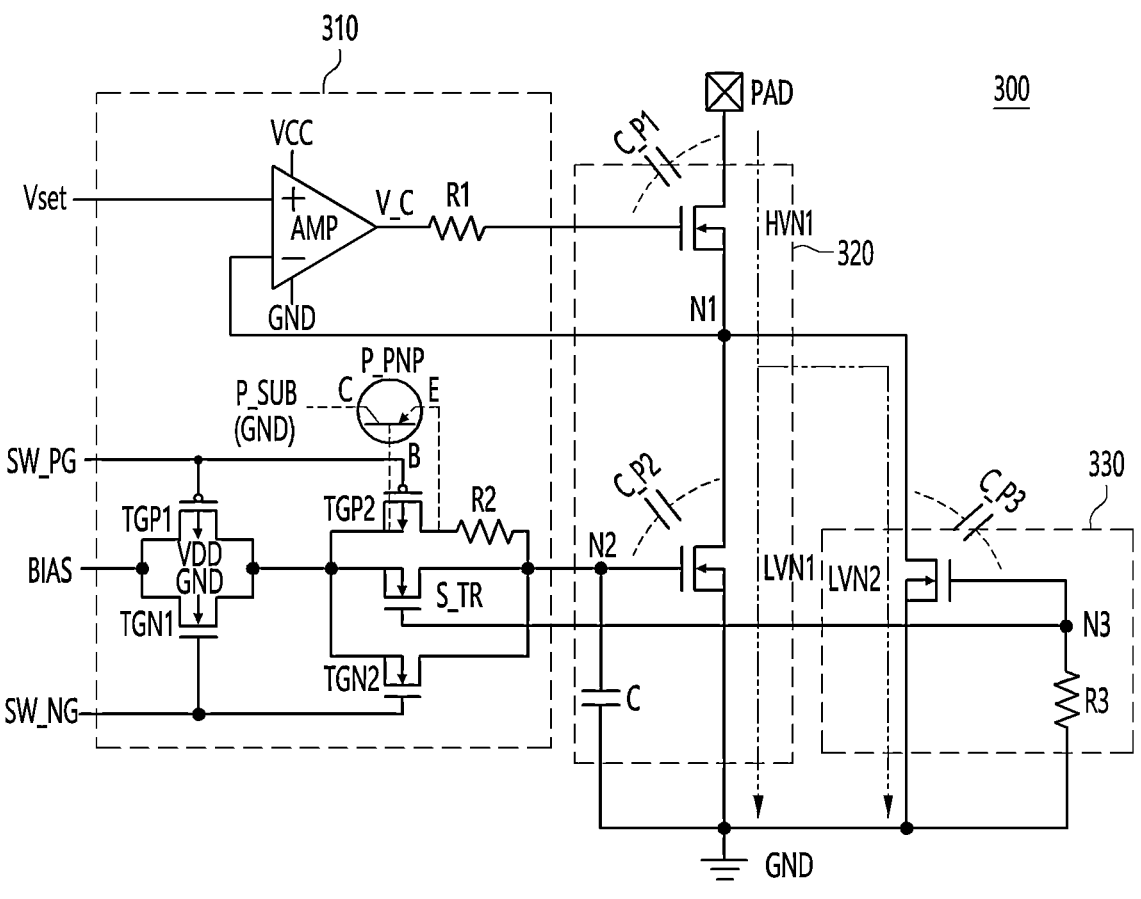
FIG. 5 is a diagram illustrating operation characteristics for discharge when static electricity flows into the current source device of FIG. 3.

Meanwhile, FIG. 5 is a diagram illustrating operation characteristics for discharge when static electricity flows into the current source device 300 of FIG. 3.

When static electricity flows into the pad (PAD) of the current source device 300, the voltage level of the pad (PAD) can momentarily become a voltage level significantly higher than 80V. For convenience of explanation, it can be assumed that positive static electricity (hereinafter referred to as 'static electricity') can flow into the current source device 300 and that the current source device 300 can be not operating. In other words, it can be assumed that static electricity flows in from the outside through the pad (PAD) when the current source device 300 can be not in use.

The static electricity flowing into the pad (PAD) can increase the voltage of the gate terminal of the high-voltage N-type first MOS transistor HVN1 by the first parasitic capacitor C_P1 formed between one terminal and the gate terminal of the high-voltage N-type first MOS transistor HVN1. Since the first resistor R1 is formed between the gate terminal of the high-voltage N-type first MOS transistor HVN1 and the output terminal of the amplifier AMP, the rate at which the voltage level increases of the gate terminal of the high-voltage N-type first MOS transistor HVN1 can be determined by a time constant determined by multiplying the capacitance of the first parasitic capacitor C_P1 and the resistance value of the first resistor R1.

In order to efficiently utilize the current source device 300 according to an embodiment of the present disclosure, it is desirable for the time constant to be about 300 ns (nanoseconds) or more, but it is not limited thereto.

When the voltage (Vgs) between the gate terminal and the other terminal of the high-voltage N-type first MOS transistor HVN1 in accordance with the increase of the voltage level of the gate terminal of the high-voltage N-type first MOS transistor HVN1 is greater than the threshold voltage of the high-voltage N-type first MOS transistor HVN1, the high-voltage N-type first MOS transistor HVN1 can be turned on, thereby increasing the voltage level of the first node N1.

Through the same process in which the high-voltage N-type first MOS transistor HVN1 is turned on by the rising voltage level of the pad (PAD), the increase of the voltage level of the first node N1 causes to turn on the low-voltage N-type first MOS transistor LVN1. Accordingly, static electricity will eventually flow through the high-voltage N-type first MOS transistor HVN1 and the low-voltage N-type first MOS transistor LVN1.

However, by the capacitor C disposed between the gate terminal of the low-voltage N-type first MOS transistor LVN1 and the ground power source GND, the voltage level of the gate terminal of the low-voltage N-type first MOS transistor LVN1 can be slightly greater than the threshold voltage of the low-voltage N-type first MOS transistor LVN1, and the voltage maintenance period can be not so long, thus only a portion of the static electricity flowing into the pad (PAD) can be discharged through the low-voltage N-type first MOS transistor LVN1.

Therefore, static electricity flowing from the pad PAD can be discharged by the first resistor R1. In particular, when the amount of static electricity current is small (less than the predetermined threshold), it can be effectively discharged using only the first resistor R1.

In the present disclosure, by including the first resistor R1 in the control circuit 310, a portion of the static electricity can be discharged in the sourcing circuit 320, and the remaining of the static electricity can be discharged through the discharge circuit 330.

According to an embodiment of the present disclosure, the transistor included in the discharge circuit 330 can be a low-voltage N-type second MOS transistor LVN2 rather than a high-voltage transistor such as a high-voltage N-type first MOS transistor HVN1.

The high-voltage N-type first MOS transistor HVN1 should be able to pass a significant amount of current, so the gate width of the high-voltage N-type first MOS transistor HVN1 should be at least several millimeters. Accordingly, a significant amount of area on the layout should be assigned to the high-voltage N-type first MOS transistor HVN1. On the other hand, according to the present disclosure, the discharge circuit 330, using the low-voltage N-type second MOS transistor LVN2 rather than the high-voltage N-type first MOS transistor HVN1, can generate an optimal electrostatic discharge path, thereby solving problems caused by employing the high-voltage N-type first MOS transistor HVN1 in the discharge circuit 330.

One terminal of the low-voltage N-type second MOS transistor LVN2 can be connected to the first node N1. The gate terminal of the low-voltage N-type second MOS transistor LVN2 can be connected to one terminal of the third resistor R3, the other terminal of which can be connected to the ground power source GND.

When static electricity flows into the current source device 300, the voltage level of the first node N1 will rise due to the high-voltage N-type first MOS transistor HVN1 being turned on, and the gate voltage of the low-voltage N-type second MOS transistor LVN2 increases due to the third parasitic capacitor C_P3 formed between the first node N1 and the gate terminal of the low-voltage N-type second MOS transistor LVN2. In this case, the increase rate of the gate voltage of the low-voltage N-type second MOS transistor LVN2 can be determined by, for example, the product of the capacitance of the third parasitic capacitor C_P3 and the resistance value of the third resistor R3. The gate voltage of the low-voltage N-type second MOS transistor LVN2, which increases due to the incoming static electricity, causes to turn on the low-voltage N-type second MOS transistor LVN2, and the static electricity current flows through the first node N1 can be discharged through the low-voltage N-type second MOS transistor LVN2.

In the above, the first resistor R1 and the third resistor R3 determine the rise time of the gate voltage of the high-voltage N-type first MOS transistor HVN1 and the gate voltage of the low-voltage N-type second MOS transistor LVN2, respectively. In addition to determining the rise time, the discharge time can also be determined by the first resistor R1 and the third resistor R3. In other words, in the present disclosure, charging and discharging time can be adjusted as needed depending on the magnitude or amount of static electricity to be discharged or the amount of static electricity current, and this principle can be applied to various circuits.

Meanwhile, as described above, when static electricity flows into the current source device 300, static electricity can be discharged through the low-voltage N-type first MOS transistor LVN1 included in the sourcing circuit 320. However, in this case, when the voltage of the gate terminal of the low-voltage N-type first MOS transistor LVN1, which can be maintained for a short time, becomes lower than the threshold voltage of the low-voltage N-type first MOS transistor LVN1, the low-voltage N-type first MOS transistor LVN1 can be turned off momentarily, thereby being induced a peak voltage in the first node N1.

Additionally, when the gate voltage of the low-voltage N-type first MOS transistor LVN1 increases, the parasitic PNP transistor P_PNP shown in FIG. 3 can be turned on and a current can flow through it.

The control circuit 310 according to the present disclosure can include the short transistor S_TR to suppress the generation of peak voltage at one terminal of the second transmission gate TG2 while performing the discharge function. In addition, the control circuit 310 according to the present disclosure can also include the second resistor R2 to prevent a current from flowing into the parasitic PNP transistor P_PNP.

When static electricity flows into the current source device 300, the voltage level of the third node (N3) can rise, and since the third node N3 is connected to the gate terminal of the short transistor S_TR, the short transistor S_TR turns on. So, both terminals of the second transmission gate TG2 can be electrically connected to each other, thereby blocking to turn on the parasitic PNP transistor P_PNP due to the voltage difference between the base terminal B and emitter terminal E of the parasitic PNP transistor P_PNP.

The function of the second resistor R2 can be the same as that of the above-described first resistor R1 and third resistor R3, so the corresponding content will be used or applied mutatis mutandis and redundant explanation will be omitted here.

In this way, when static electricity flows into the current source device 300, the second resistor R2 can be such that the voltage level of the gate terminal of the low-voltage N-type first MOS transistor LVN1 is maintained the state higher than the threshold voltage for a certain period of time, the parasitic PNP transistor P_PNP can be maintained in a turned-off state by the short transistor S_TR.

At this time, in the current source device 300 according to an embodiment of the present disclosure, the resistance value of the second resistor R2 can be greater than the turn-on resistance Ron of the short transistor S_TR. However, the present disclosure is not limited to this.

In FIG. 5, the path through which static electricity is discharged can be shown as a double-dot chain line, and the thickness of the one-dot chain line means that the amount of discharge current can be less in a thin path compared to a thick path.

The current source device 300 as described above can be implemented by including all of a first resistor R1, a second resistor R2, and a short transistor S_TR.

The current source device 300 can be implemented by comprising only some of the first resistor R1, the second resistor R2, the short transistor S_TR, and the discharge circuit 330.

Hereinafter, a current source device 300 according to another embodiment of the present disclosure will be described with reference to FIGS. 6 to 8. At this time, in explaining the current source device 300 disclosed in FIGS. 6 to 8, the description of the same components as the current source device 300 disclosed in FIGS. 3 to 5 (hereinafter referred to as FIG. 3) can be the same as the above-mentioned content. Please make it clear in advance that this will be used or applied mutatis mutandis, and the explanation will focus on the differences.

Figure 6:
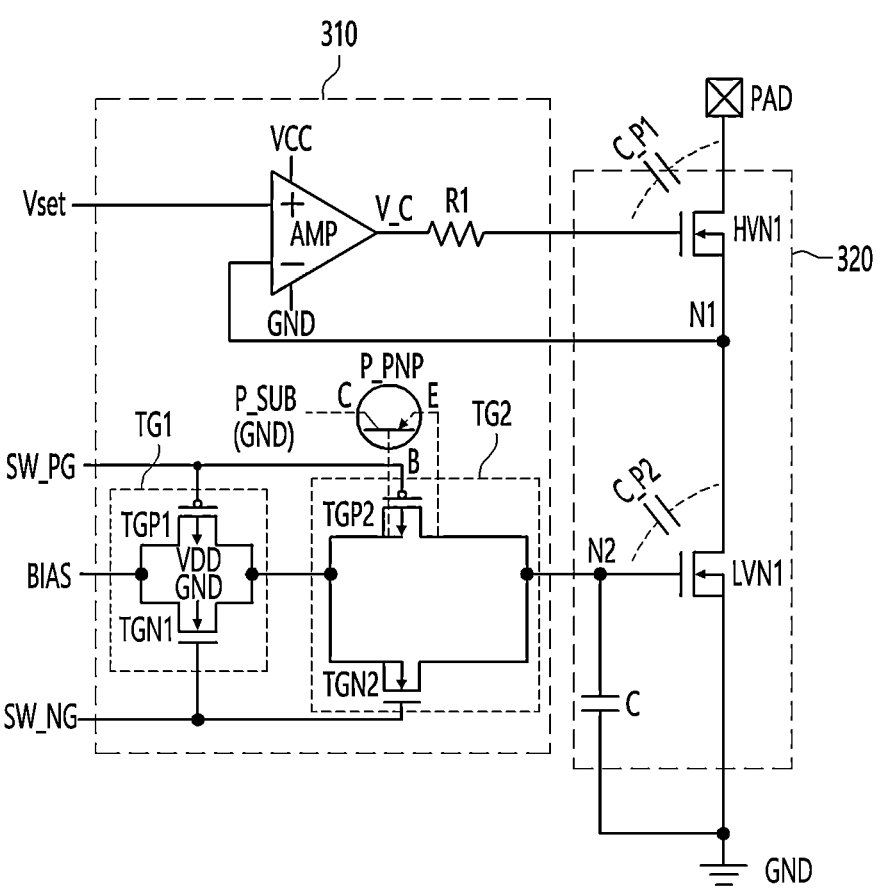
FIG. 6 illustrates a circuit diagram of a current source device according to another embodiment of the present disclosure.

FIG. 6 illustrates a circuit diagram of a current source device according to another embodiment of the present disclosure.

Figure 7:
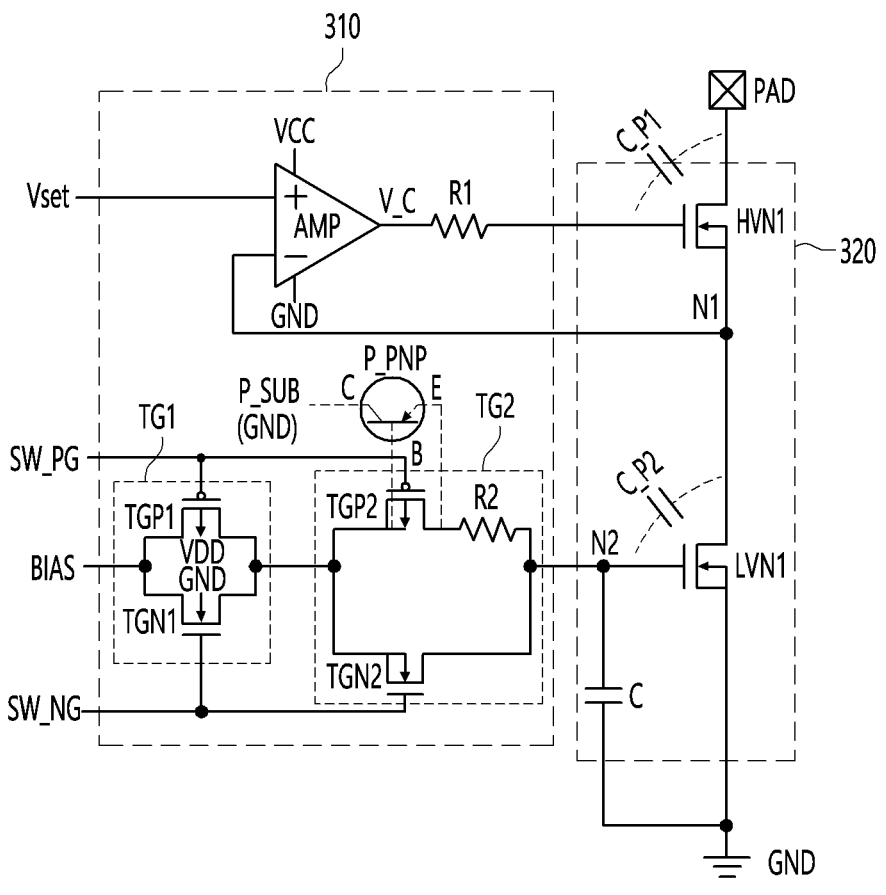
FIG. 7 illustrates a circuit diagram of a current source device according to another embodiment of the present disclosure.

FIG. 7 illustrates a circuit diagram of a current source device according to another embodiment of the present disclosure.

Figure 8:
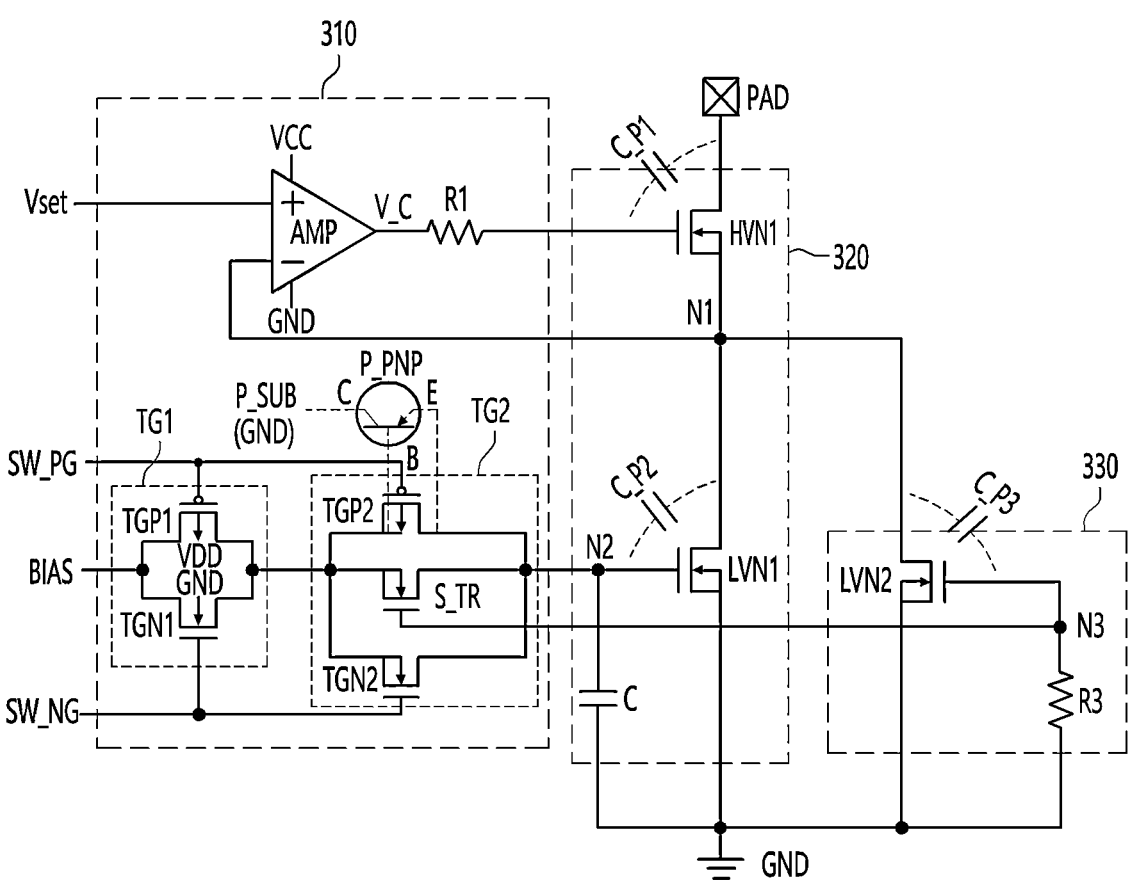
FIG. 8 illustrates a circuit diagram of a current source device according to another embodiment of the present disclosure.

FIG. 8 illustrates a circuit diagram of a current source device according to another embodiment of the present disclosure.

First, referring to FIG. 6, the current source device 300 includes only the first resistor R1 among the first resistor R1, the second resistor R2, the short transistor S_TR, and the discharge circuit 330 compared to the current source device 300 shown in FIG. 3.

Even though the current source device 300 of FIG. 6 does not include the second resistor R2, the short transistor S_TR, and the discharge circuit 330 compared to the current source device 300 of FIG. 3, the discharge function can be effectively performed through the sourcing circuit 320 with only the resistor R1 in case that the amount of static electricity current is less than the predetermined threshold as described above.

Next, referring to FIG. 7, the current source device 300 includes the first resistor R1 and the second resistor R2 among the first resistor R1, the second resistor R2, the short transistor S_TR, and the discharge circuit compared to the current source device 300 shown in FIG. 3.

Even though the current source device 300 of FIG. 7 does not include the short transistor S_TR and the discharge circuit 330 compared to the current source device 300 of FIG. 3, static electricity current can be discharged in the sourcing circuit 320 with the first resistor R1 and, in the control circuit 310, the current flowing into the parasitic PNP transistor P_PNP can be blocked through the second resistor R2.

Next, referring to FIG. 8, the current source device 300 includes the first resistor R1, the short transistor S_TR, and the discharge circuit 330 among the first resistor R1, the second resistor R2, the short transistor S_TR, and the discharge circuit 330 compared to the current source device 300 shown in FIG. 3.

Even though the current source device 300 of FIG. 8 does not include the second resistor R2 compared to the current source device 300 of FIG. 3, a portion of static electricity current can be discharged in the sourcing circuit 320 with the first resistor R1 and the rest of the static electricity current can be discharged through the short transistor S_TR and the discharge circuit 330, as described above.

Accordingly, the current source device 300 according to FIGS. 6 to 8 can perform its function for the above-described purpose, for example.

The current source device 300 according to an embodiment of the present disclosure, for example, can check the amount of static electricity current, and control some of the first resistor R1, the second resistor R2, the short transistor S_TR, and the discharge circuit 330 in the current source device 300 shown in FIG. 3 to be activated or deactivated as the result of the check, depending on the amount of static electricity current. In this case, for example, a switching circuit such as a switch can be further included in the current source device 300 to control on/off or activation/deactivation of all or some of the corresponding components as described above.

FIGS. 3 to 8 illustrated based on one channel (CH). In other words, a single current source device 300 according to the present disclosure can be provided for each channel and operate as described above.

In the present disclosure, for example, the current source device 300 in some of channels can be implemented as shown in FIG. 3, and the current source device 300 in other channels can be implemented as shown in one of FIGS. 6 to 8.

Figure 9:
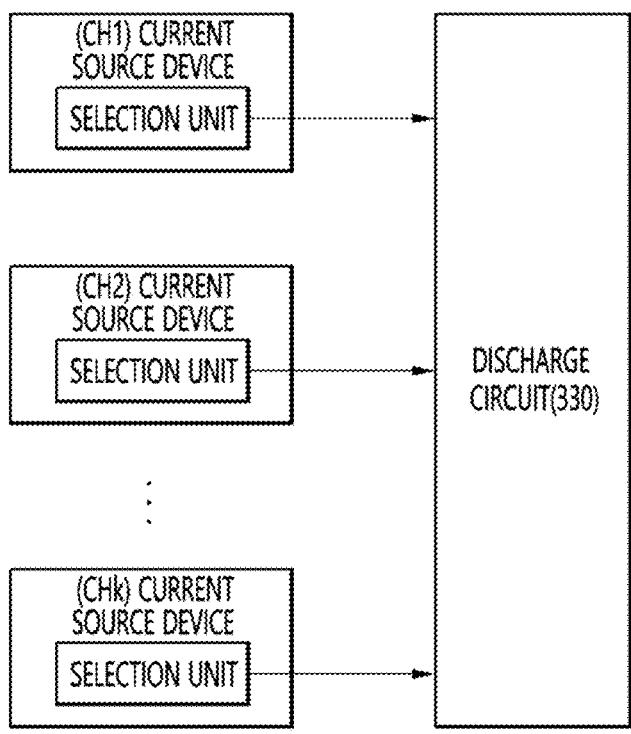
FIGS. 9 to 11 illustrate circuit diagrams of a current source device according to another embodiment of the present disclosure.
Figure 10:
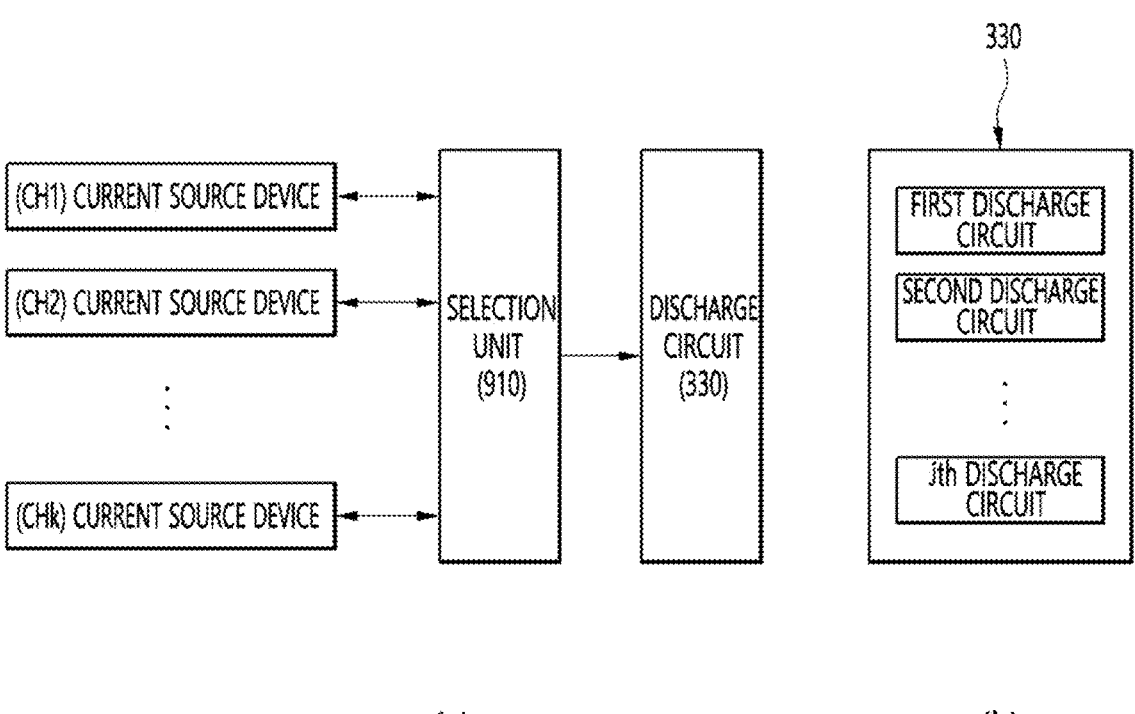
Figure 11:
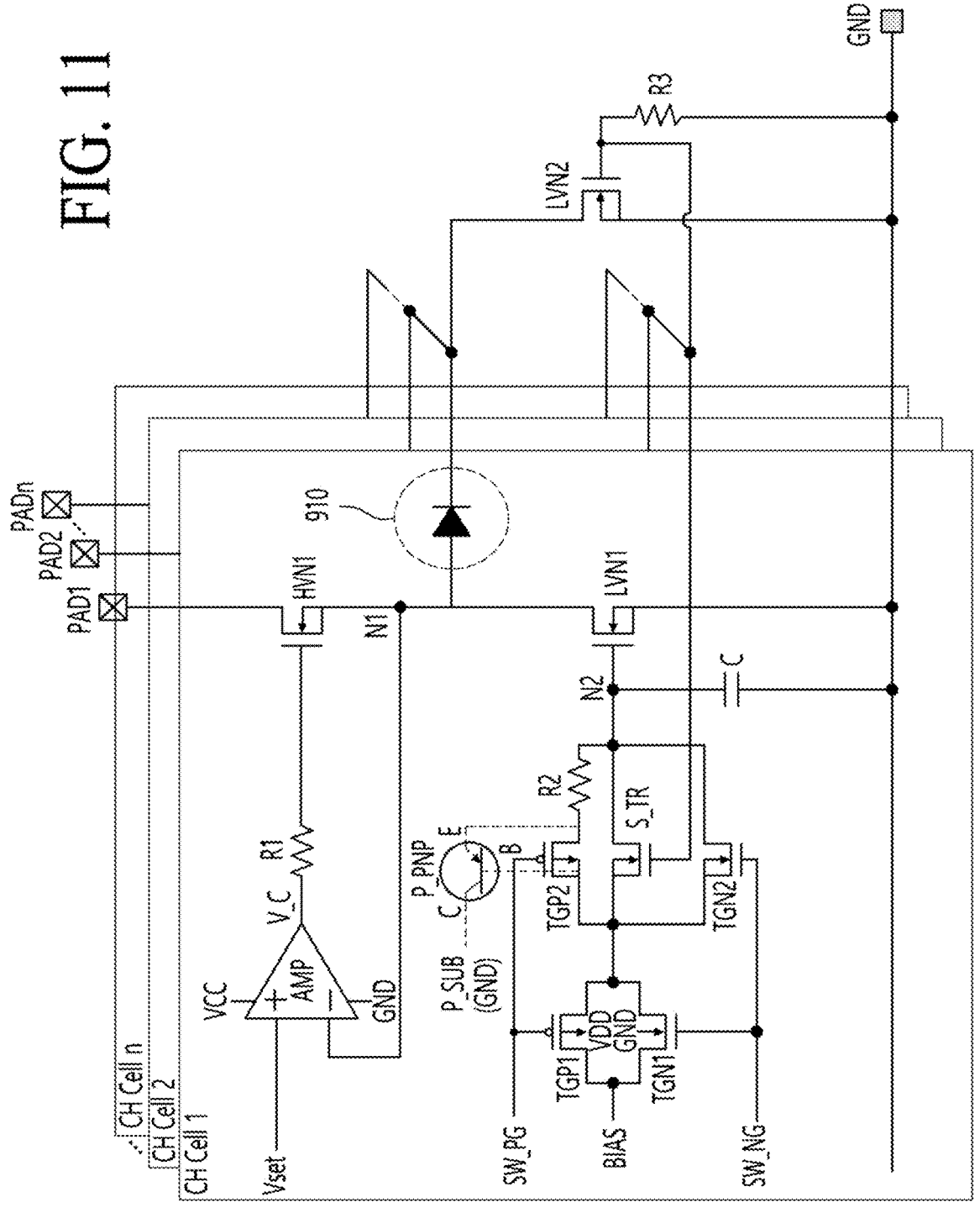

FIGS. 9 and 10 are a block diagram of the current source device 300 according to another embodiment of the present disclosure, and FIG. 11 illustrates a circuit diagram of the current source device 300 according to another embodiment of the present disclosure.

Referring to FIG. 9, all or part of a plurality of channels (k channels, k is a natural number) can be grouped. Channels grouped in this way can share, for example, the discharge circuit 330. Therefore, according to the present disclosure, even if the discharge circuit 330 is shared in common by the grouped channels, the chip size can be further reduced compared to the above-described embodiment.

At this time, the current source device 300 for each channel belonging to one group can include a selection unit. The selection unit can be a switching element for electrostatic discharge on corresponding channel. The selection unit can be implemented as one of, for example, a diode, a multiplexer MUX, or a switch.

Accordingly, the discharge circuit 330 can be connected to or disconnected from the current source devices for channels through a selection unit included in the current source device 300. So, the discharge circuit 330 can perform the discharge function only when necessary for all or some of channels.

Unlike FIG. 9, in (a) of FIG. 10, the selection unit 910 can be provided separately outside the current source device 300.

Therefore, even according to (a) of FIG. 10, like FIG. 9, the discharge function can be performed only when necessary by being connected to or disconnected from the shared discharge circuit 330 through the selection unit.

Meanwhile, in FIG. 9 and (a) of FIG. 10, the discharge circuit 330 can be implemented by including a plurality of sub-discharge circuits (j, where j is a natural number), for example, as shown in (b) of FIG. 10. In this case, each sub-discharge circuit can have the same performance or different performance. In the above, j is preferably equal to or smaller than k, but is not limited thereto.

As shown in (b) of FIG. 10, when the discharge circuit 330 includes a plurality of sub-discharge circuits, the current source device 300 can perform a discharge function through the corresponding sub-discharge circuit according to the amount of electrostatic current.

Meanwhile, FIG. 11 illustrates, for example, a circuit diagram of the current source device 300 of FIG. 9.

The current source device 300 for each channel in FIG. 11 can be similar to any one of FIGS. 3 to 8 described above, but the discharge circuit 330 can be not included in the current source device 300. Meanwhile, in FIG. 11, the current source device 300 for each channel can include the selection unit 910.

In FIG. 11, the selection unit 910 can be implemented with a 5V diode, but it is not limited to this. Such the selection unit 910 can be disposed between the first node N1 and one terminal of the low-voltage N-type second MOS transistor LVN2 of the shared discharge circuit 330.

Additionally, referring to FIG. 11, gate terminal of the short transistor S_TR of the current source device 300 of each channel can also be connected to the third node N3 of the shared discharge circuit 330.

As shown in FIG. 11, the current source device 300 can include only a discharge diode as the selection unit 910, and the discharge circuit 330 including a much larger low voltage N-type second MOS transistor LVN2 can be shared by channels, thereby dramatically reducing the chip size. Also, the power consumed for the discharge function can also be reduced depending on the number of channels where electrostatic is generated.

Figure 12:
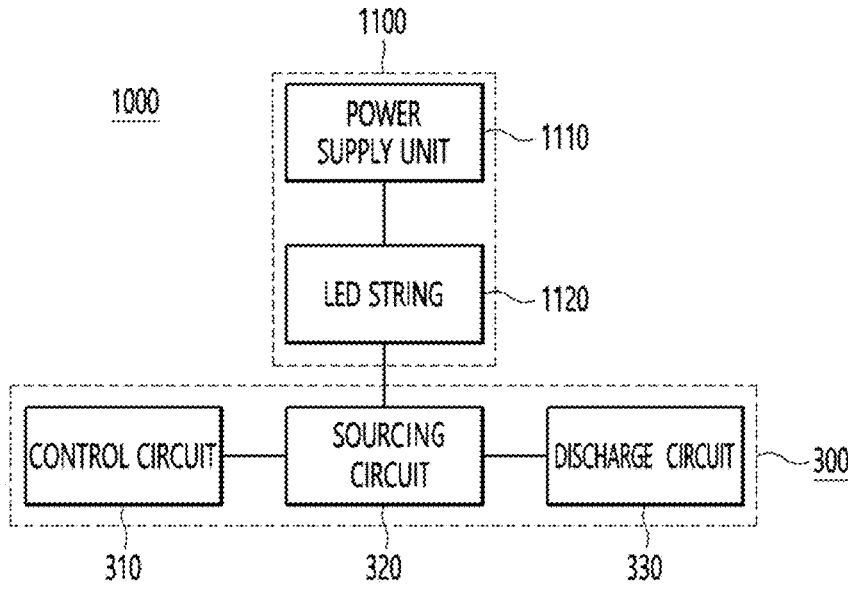
FIG. 12 illustrates a block diagram of a display device including a current source device according to at least one of various embodiments of the present disclosure.

FIG. 12 illustrates a block diagram of a display device including a current source device 300 according to at least one of various embodiments of the present disclosure.

Referring to FIG. 12, a display device 1000 including digital signage can include a current source device 300 and a signage part 1100.

Signage part 1100 can be an outdoor advertisement using a digital information display, and can be used on a billboard where a control center controls advertisement content through a communication network. Signage part 1100 can also be one of the display devices using an LED string 1120 that operates using power supplied from the power supply unit 1110.

In this way, the signage part 1100 including the power supply unit 1110 and the LED string 1120 can use the current source device 300 according to the present disclosure. Accordingly, it is possible to adjust the amount of current flowing through the LED string 1120 while preparing for static electricity on the other hand.

Meanwhile, in the case of FIGS. 9 to 12, although the selection unit or the discharge circuit 330 is implemented outside the current source device 300, it can be viewed as a separate configuration. However, depending on the embodiment, the current source device 300 according to the present disclosure can be used to include the selection unit or the discharge circuit 330 in the case of FIGS. 9 to 12.

In the above, the technical idea of the present invention has been described along with the accompanying drawings, but this is an exemplary description of a preferred embodiment of the present invention and does not limit the present invention. In addition, it is clear that anyone skilled in the art can make various modifications and imitations without departing from the scope of the technical idea of the present invention.

What is claimed is:

1. A current source device comprising:
   a sourcing circuit including a first MOS transistor configured to transmit a current flowing from a pad to a first node in response to a current control voltage and a second MOS transistor configured to transmit the current flowing from the first node to a ground in response to a bias voltage;
   a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal; and
   a discharge circuit configured to discharge a current corresponding to static electricity flowing from the first node to the ground,
   wherein the current flowing from the pad contains the current corresponding to the static electricity,
   wherein a withstand voltage of the first MOS transistor is higher than a withstand voltage of the second MOS transistor,
   wherein the discharge circuit includes a third MOS transistor, and
   wherein a gate terminal of the third MOS transistor is connected to a second node, and one terminal of the third MOS transistor is connected to the first node and another terminal of the third MOS transistor is connected to the ground.

2. The current source device according to claim 1, wherein the first switch includes:
   a first P-type transistor configured to supply the bias voltage provided to one terminal of the first P-type transistor to the gate terminal of the second MOS transistor which is connected to another terminal of the first P-type transistor in response to a switch control signal applied to a gate terminal of the first P-type transistor; and
   a first N-type transistor configured to supply the bias voltage provided to one terminal of the first N-type transistor to the gate terminal of the second MOS transistor which is connected to another terminal of the first N-type transistor in response to another switch control signal applied to the gate terminal of the first N-type transistor,
   a frequency of the switch control signal and a frequency of the another switch control signal are the same, and
   a phase of the switch control signal and a phase of the another switch control signal are opposite.

3. The current source device according to claim 2, wherein the first switch includes a second resistor disposed between the another terminal of the first P-type transistor and the gate terminal of the second MOS transistor.

4. The current source device according to claim 2, further comprising a second switch configured to transmit the bias voltage to the first switch in response to the switching control signal.

5. The current source device according to claim 1, wherein the first resistor has a resistance value such that a time constant that is a product of a capacitance of a parasitic capacitor between one terminal of the first MOS transistor and the gate terminal of the first MOS transistor is equal to or greater than a predetermined value.

6. The current source device according to claim 1, wherein the discharge circuit further includes a resistor, and one terminal of the resistor of the discharge circuit is connected to the second node, and another terminal of the resistor of the discharge circuit is connected to the ground.

7. The current source device according to claim 1, wherein the withstand voltage of the first MOS transistor is greater than a withstand voltage of the third MOS transistor.

8. The current source device according to claim 7, wherein the withstand voltage of the second MOS transistor is identical to the withstand voltage of the third MOS transistor.

9. The current source device according to claim 1, wherein the first switch further includes a short transistor configured to short one end of the first switch to another end of the first switch in response to a voltage of the second node.

10. The current source device according to claim 1, wherein the sourcing circuit further includes a capacitor disposed between the gate terminal of the second MOS transistor and the ground.

11. The current source device according to claim 10, wherein the first switch includes:
   a first P-type transistor configured to supply the bias voltage provided to one terminal of the first P-type transistor to the gate terminal of the second MOS transistor which is connected to another terminal of the first P-type transistor in response to a switch control signal applied to a gate terminal of the first P-type transistor, and
   a second resistor disposed between said another terminal of the first P-type transistor and the gate terminal of the second MOS transistor, and
   a resistance value of the second resistor is greater than a turn-on resistance value of a short transistor.

12. A display device comprising:
   a signage including an LED string configured to operate using a current supplied from a power supply; and
   a current source device configured to control an amount of the current supplied from the power supply to the LED string,
   wherein the current source device includes:
   a sourcing circuit including a first MOS transistor configured to transmit a current flowing from a pad to a first node in response to a current control voltage, and a second MOS transistor configured to transmit the current flowing from the first node to a ground in response to a bias voltage;
   a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal; and a discharge circuit configured to discharge a current corresponding to static electricity flowing from the first node to the ground, wherein the current flowing from the pad contains the current corresponding to the static electricity, wherein a withstand voltage of the first MOS transistor is higher than a withstand voltage of the second MOS transistor, wherein the discharge circuit includes a third MOS transistor, and wherein a gate terminal of the third MOS transistor is connected to a second node, and one terminal of the third MOS transistor is connected to the first node and another terminal of the third MOS transistor is connected to the ground.

13. A display device comprising:

one or more current source devices, wherein each of the one or more current source devices includes:

a sourcing circuit including a first MOS transistor configured to transmit a current flowing from a pad to a first node in response to a current control voltage, and a second MOS transistor configured to transmit the current flowing from the first node to a ground in response to a bias voltage;

a control circuit including an amplifier configured to generate the current control voltage based on a setting voltage applied from an outside and a voltage of the first node, a first resistor disposed between an output terminal of the amplifier and a gate terminal of the first MOS transistor, and a first switch configured to transmit the bias voltage to a gate terminal of the second MOS transistor in response to a switching control signal;

a selection unit configured to control a discharge function of the one or more current source devices; and a discharge circuit configured to discharge a current corresponding to static electricity flowing from the pad to the ground, wherein a withstand voltage of the first MOS transistor is higher than a withstand voltage of the second MOS transistor, wherein the discharge circuit includes a third MOS transistor and a third resistor, wherein one terminal of the third MOS transistor is connected to the first node, and another terminal of the third MOS transistor is connected to the ground, and wherein one terminal of the third resistor is connected to a gate terminal of the third MOS transistor and another terminal of the third resistor is connected to the ground.

14. The display device according to claim 13, wherein one terminal of the selection unit is connected to the first node of the each of the one or more current source devices and another terminal of the selection unit is connected to the gate terminal of the third MOS transistor in the discharge circuit.

15. The display device according to claim 13, wherein the selection unit is consisted of one of a diode, a multiplexer, and a switch.

16. The display device according to claim 13, wherein the each of the one or more current source devices comprises a plurality of current source devices, each of the plurality of current source devices is configured to function for each channel, and the discharge circuit is shared with the plurality of the current source device for multiple channels.

* * * * *